(12) United States Patent
Karlgaard et al.

(10) Patent No.: US 11,982,544 B2
(45) Date of Patent: May 14, 2024

(54) DISTRIBUTED CONTROL OF ENERGY STORAGE DEVICE CHARGING AND GRID STABILITY

(71) Applicant: Landis+Gyr Innovations, Inc., Alpharetta, GA (US)

(72) Inventors: Matt Karlgaard, Brainerd, MN (US); Dayanna Palacios Vivanco, Marietta, GA (US)

(73) Assignee: Landis+Gyr Technology, Inc., Alpharetta, GA (US)

( * ) Notice: Subject to any disclaimer, the term of this patent is extended or adjusted under 35 U.S.C. 154(b) by 189 days.

(21) Appl. No.: 17/665,198

(22) Filed: Feb. 4, 2022

(65) Prior Publication Data
US 2022/0244076 A1  Aug. 4, 2022

Related U.S. Application Data

(60) Provisional application No. 63/145,660, filed on Feb. 4, 2021.

(51) Int. Cl.
*B60L 53/63* (2019.01)
*G01D 4/00* (2006.01)
*G01R 22/06* (2006.01)
*H02J 3/00* (2006.01)
*H02J 3/38* (2006.01)
*H02J 7/00* (2006.01)

(52) U.S. Cl.
CPC ............ *G01D 4/004* (2013.01); *B60L 53/63* (2019.02); *G01R 22/063* (2013.01); *H02J 3/003* (2020.01); *H02J 3/381* (2013.01); *H02J 2300/26* (2020.01)

(58) Field of Classification Search
None
See application file for complete search history.

(56) References Cited

U.S. PATENT DOCUMENTS

| 4,463,311 A | 7/1984 | Kobayashi |
| 6,420,801 B1 | 7/2002 | Seefeldt |

(Continued)

FOREIGN PATENT DOCUMENTS

| CA | 3089472 C | * | 8/2023 | ............ B60L 53/305 |
| CN | 1403825 | | 3/2003 | |

(Continued)

OTHER PUBLICATIONS

U.S. Appl. No. 16/793,876, Ex Parte Quayle Action mailed Apr. 13, 2020, 6 pages.

(Continued)

*Primary Examiner* — Curtis A Kuntz
*Assistant Examiner* — Jerold B Murphy
(74) *Attorney, Agent, or Firm* — Kilpatrick Townsend & Stockton LLP

(57) ABSTRACT

An edge computing device may control load devices and DER (distributed energy resource) devices. The edge computing device may be associated with an electric meter located at a premises or with a distribution transformer located at a secondary substation. The control of the load devices and DER devices may be based in part on forecasted pricing information that considers factors such as equipment ratings for distribution equipment, environmental conditions, historical patterns of generation and load, and user input.

18 Claims, 14 Drawing Sheets

(56) References Cited

U.S. PATENT DOCUMENTS

| | | | |
|---|---|---|---|
| 8,784,130 B2* | 7/2014 | Scott | H01R 33/945 439/640 |
| 9,318,861 B2 | 4/2016 | Fulton et al. | |
| 9,437,986 B2 | 9/2016 | Knauer et al. | |
| 9,484,653 B1 | 11/2016 | Chen | |
| 9,595,815 B2 | 3/2017 | Knauer et al. | |
| 9,960,637 B2 | 5/2018 | Sanders et al. | |
| 10,886,748 B1 | 1/2021 | Karlgaard et al. | |
| 11,316,348 B2 | 4/2022 | Karlgaard et al. | |
| 2003/0034693 A1 | 2/2003 | Wareham et al. | |
| 2008/0091625 A1 | 4/2008 | Kremen | |
| 2010/0003848 A1* | 1/2010 | Scott | H01R 9/2491 29/729 |
| 2010/0105226 A1 | 4/2010 | Gong et al. | |
| 2010/0306027 A1 | 12/2010 | Haugh | |
| 2013/0046411 A1* | 2/2013 | Al Faruque | H02J 3/322 700/286 |
| 2013/0123997 A1* | 5/2013 | King | H02H 3/46 700/292 |
| 2013/0274937 A1* | 10/2013 | Ahn | H04L 12/12 700/291 |
| 2015/0233980 A1 | 8/2015 | Umetsu et al. | |
| 2016/0124411 A1 | 5/2016 | Tinnakornsrisu et al. | |
| 2016/0181752 A1* | 6/2016 | Parks | G06Q 30/0201 439/517 |
| 2017/0005515 A1* | 1/2017 | Sanders | H02J 3/388 |
| 2017/0168516 A1 | 6/2017 | King | |
| 2017/0194792 A1 | 7/2017 | Zimmanck et al. | |
| 2017/0212160 A1 | 7/2017 | Fulton et al. | |
| 2017/0346296 A1 | 11/2017 | Schamber et al. | |
| 2018/0083446 A1 | 3/2018 | Kern | |
| 2020/0225263 A1 | 7/2020 | Karlgaard | |
| 2020/0379021 A1 | 12/2020 | Karlgaard et al. | |

FOREIGN PATENT DOCUMENTS

| | | |
|---|---|---|
| CN | 201467023 | 5/2010 |
| CN | 201623651 | 11/2010 |
| CN | 101976854 | 2/2011 |
| CN | 103138291 | 6/2013 |
| CN | 103187735 | 7/2013 |
| CN | 105242087 | 1/2016 |
| JP | 2011204045 | 10/2011 |
| WO | 03014748 | 2/2003 |
| WO | 2011124657 | 10/2011 |
| WO | 2016167722 | 10/2016 |
| WO | 2017205724 | 11/2017 |

OTHER PUBLICATIONS

U.S. Appl. No. 16/793,876, Notice of Allowance mailed Aug. 10, 2020, 8 pages.
U.S. Appl. No. 16/793,876, Notice of Allowance mailed Sep. 4, 2020, 8 pages.
International Patent Application No. PCT/US2020/054544, International Search Report and Written Opinion mailed Feb. 15, 2021, 21 pages.
International Application No. PCT/US2022/015310, Invitation to Pay Additional Fees, May 9, 2022, 12 pages.
International Application No. PCT/US2022/015310, International Search Report and Written Opinion mailed on Jul. 1, 2022, 17 pages.

* cited by examiner

DISTRIBUTED CONTROL OF ENERGY STORAGE DEVICE CHARGING AND GRID STABILITY

CROSS-REFERENCE TO RELATED APPLICATION

This application claims priority to U.S. Patent Application No. 63/145,660 filed Feb. 4, 2021, the entire contents of which is incorporated herein by reference.

TECHNICAL FIELD

The present disclosure is generally related to grid control systems. More particularly, the present disclosure is related to distributed control of electric vehicle and energy storage device charging to maintain grid stability.

BACKGROUND

In a resource distribution system, such as an electric grid that delivers electric power, a meter is used to measure and control consumption at a customer premises. The meter may include a metrology module for measuring consumption and monitoring power characteristics and a communications module for communicating with a central system, such as a head-end system, as well as other modules and components.

When a distributed energy resource (DER) device, such a solar panel array, wind turbine, water turbine, battery, an electric vehicle (EV) charger, EV, an energy storage device, or generator, is located at a customer premises, the power generated or stored by the DER device may be used at the premises or output to the electric grid. Additionally, the EV charger, EV, and energy storage device may also receive power from the electric grid for storage and use at a later time. In some systems, a separate meter and meter socket are needed to connect the DER device to the grid. These separate devices may not allow a central system, such as a head-end system, to control the connection of the DER device to the grid. In other systems, an integrated device may connect both the DER device and the premises meter to the grid. However, these integrated devices may not provide optimum control of the DER device. Thus, there is a need for an improved system for controlling and communicating with DER devices at a premises.

SUMMARY

Aspects and examples are disclosed for systems and methods for controlling load devices and DER (distributed energy resource) devices using one or more edge computing devices. An electric meter may include an edge computing device, a communications module, and a port for connecting to a first load device. The edge computing device at the meter may send load forecast information to an edge computing device associated with a distribution transformer. The edge computing device at the transformer may generate price interval data based on the load forecast information and send it to the meter. The edge computing device at the meter controls the load device based on the price interval data to operate using normal operating parameters when the price interval data includes low-cost time intervals or to operate using energy-saving operating parameters when the price interval data includes high-cost time intervals. The edge computing device at the electric meter may also control a DER device to output power to the electric grid when the price interval data includes high-cost time intervals.

In some examples, the edge computing device at the electric meter generates future pricing data. The future pricing data corresponds to time intervals after the time intervals included in the price interval data and may be based on meter-specific data.

In some examples, the edge computing device is associated with a distribution transformer and controls chargers, such as EV charges, at premises downstream of the distribution transformer. The edge computing device determines a forecasted load for the transformer and forecasted loads for the premises and uses the forecasts to control the chargers. The edge computing device may control the charging rate of the chargers or control when the chargers may charge.

These illustrative aspects and features are mentioned not to limit or define the presently described subject matter, but to provide examples to aid understanding of the concepts described in this application. Other aspects, advantages, and features of the presently described subject matter will become apparent after review of the entire application.

DETAILED DESCRIPTION

The present invention provides a system that supports communications between edge computing devices and between edge computing devices and a head-end system to control load devices and DER (distributed energy resource) devices. DER devices include devices that are capable of providing energy to the electric grid or to the premises. The energy may be generated by the device, e.g. solar panels, or stored by the device, e.g. batteries. Some DER devices, such as batteries, may be capable of both providing energy and consuming energy. The DER and load devices may be controlled based, at least in part, on forecasted pricing information. The forecasted pricing information may consider a number of factors including, but not limited to, equipment ratings for distribution equipment, e.g. distribution transformers, environmental conditions, e.g., current and forecasted weather conditions, historical patterns of generation and load, and user input. The control of the devices may include allowing a device to operate using normal operating parameters, modifying the operation of the device to use energy-saving operating parameters, or disconnecting the device. The control of the DER devices may include commands to connect the DER device to the grid, to disconnect the DER device from the grid, to connect or disconnect the DER device to the premises, or to adjust a parameter of the DER device.

Figure 1:
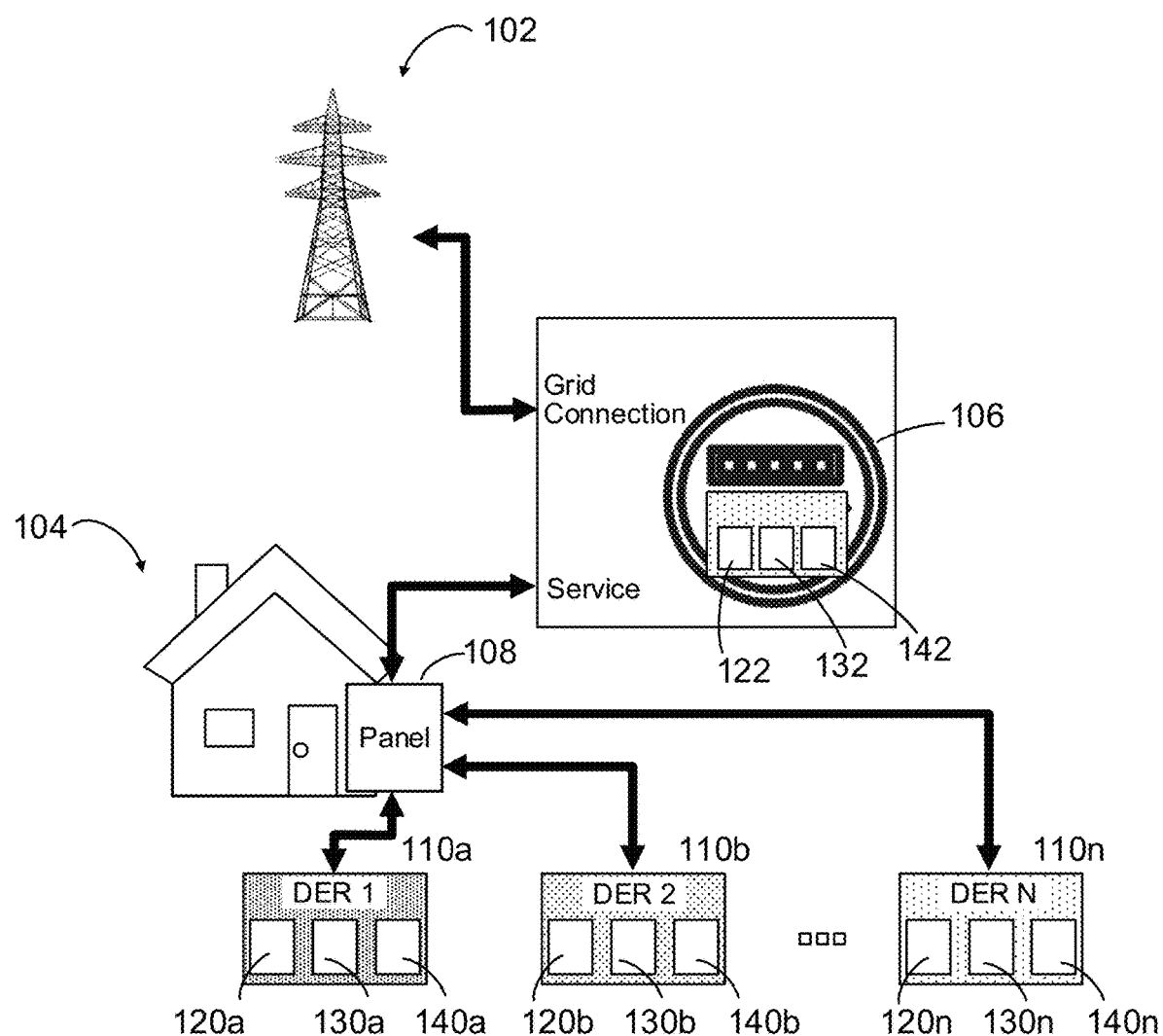
FIG. 1 is a block diagram illustrating exemplary power connections between an electric distribution network, a meter, a panel located at a premises, and multiple DER devices.

FIG. 1 illustrates exemplary power connections between an electric distribution network or grid 102, a premises 104, a meter 106, a panel 108, and multiple DER devices 110a, 110b, . . . 110n. In this example at least three DER devices are located at the same premises.

The meter 106 measures and controls electric power between the grid and the premises. The meter may include a metrology module 122, a communications module 132, and a disconnect switch 142, as well as other components. The metrology module measures consumption of electric energy and may provide revenue-grade metrology and load profiling. The communications module communicates with a central or head-end system via a communications network (not shown). The metrology module and the communications module may be separate modules or may be combined into a single module. The disconnect switch controls the flow of power from the grid through the meter to the premises.

In FIG. 1, each of the DER devices 110a, 110b, 110n may be connected to the grid and the premises via the panel 108. Each DER device can include a metrology module 120a, 120b, 120n, a communications module 130a, 130b, 130n, and a control device 140a, 140b, 140n, such as an inverter or a disconnect switch. The parameters or state of the control device may be controlled by a controller. The metrology module measures the electric power generated by the DER device. It measures the amount of energy provided by the DER device to the premises or the grid, as well as the time when the energy is provided. The measurements by the metrology module may be sufficiently accurate to provide revenue-grade billing. Alternatively, the metrology module may provide measurements or data for non-revenue-grade billing. The metrology module may provide load profiling, which may use an appropriate interval length (e.g., 1 minute intervals, 5 minute intervals, 15 minute intervals) as required by the relevant regulatory authority. It may also monitor the generated power and provide power data, such as power quality and power factor data. In some systems, the metrology module is provided by a single module, such as a meter-on-chip (MOC) module. The communications module communicates with the central system via a communications network (not shown). The metrology module and the communications module may be separate modules or may be combined into a single module. The control device controls the connection of the output of the DER device to the panel.

Although FIG. 1 illustrates that the DER devices 110a, 110b, 110n are connected to panel 108, alternative configurations are possible and may be supported by the metrology modules 120a, 120b, 120n and communication modules 130a, 130b, 130n in the DER devices. The alternatives include connecting one or more DER devices to a multi-port meter or a direct connection of a DER device to the grid. In such an example, the metrology modules 120a, 120b, 120n may form part of the meter 106, which is capable of measuring individual loads of the DER devices 110a, 110b, 110n.

The communications module in the DER device allows for low-latency bi-directional communications with the DER device. These communications may provide more or more timely information about the operation of the DER device and enable better control of the DER device than is currently available.

The metrology module and the communications module may be added to any type of DER device to enable the DER device to operate in the system of FIG. 1. These modules (or module, if combined) may be integrated into the hardware design of the DER device. There may be pads or connectors designed onto the PCB (printed circuit board) of the DER device to accommodate the addition of the modules. In some implementations, the DER device is produced by a third party and the modules are provided by the same party that provides the meter. The modules may be soldered onto the PCB or connected using a connector or wiring harness. The metrology module and the communications module in a DER device may communicate with the other components of the DER device via a wired connection, a wireless connection, or a combination thereof.

Figure 2:
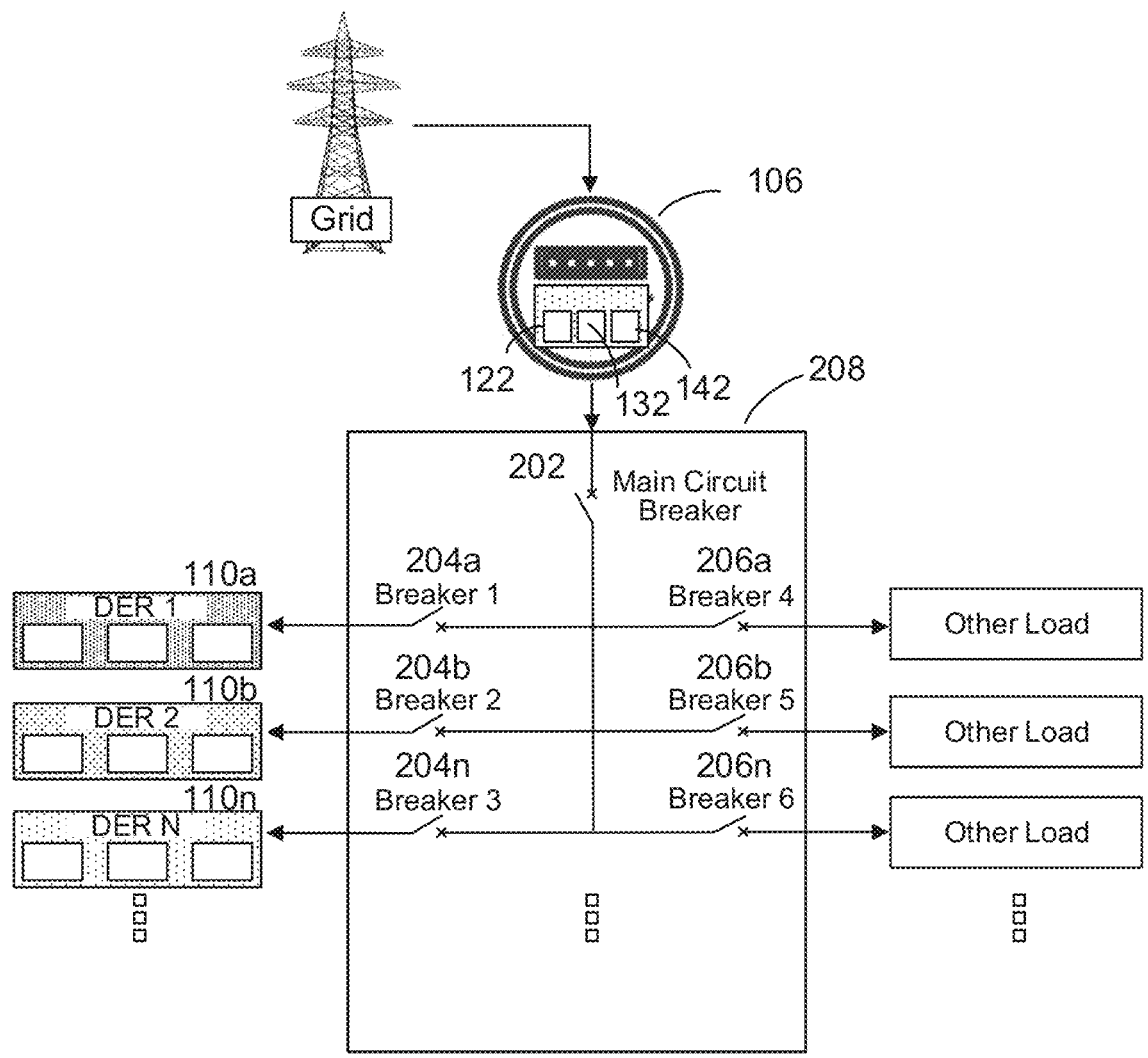
FIG. 2 is a block diagram illustrating an exemplary panel connected to a meter, multiple DER devices, and multiple loads.

The meter 106 connects the premises to the grid via the panel 108. The panel may contain a main circuit breaker that controls the connection of the premises to the meter, as well as additional circuit breakers for the DER devices and the loads located at the premises. FIG. 2 illustrates an exemplary panel 208 with a main circuit breaker 202, a circuit breaker for each DER device 204a, 204b, 204n, and circuit breakers for premises loads 206a, 206b, 206n.

Communications Using a Meter

Figure 3:
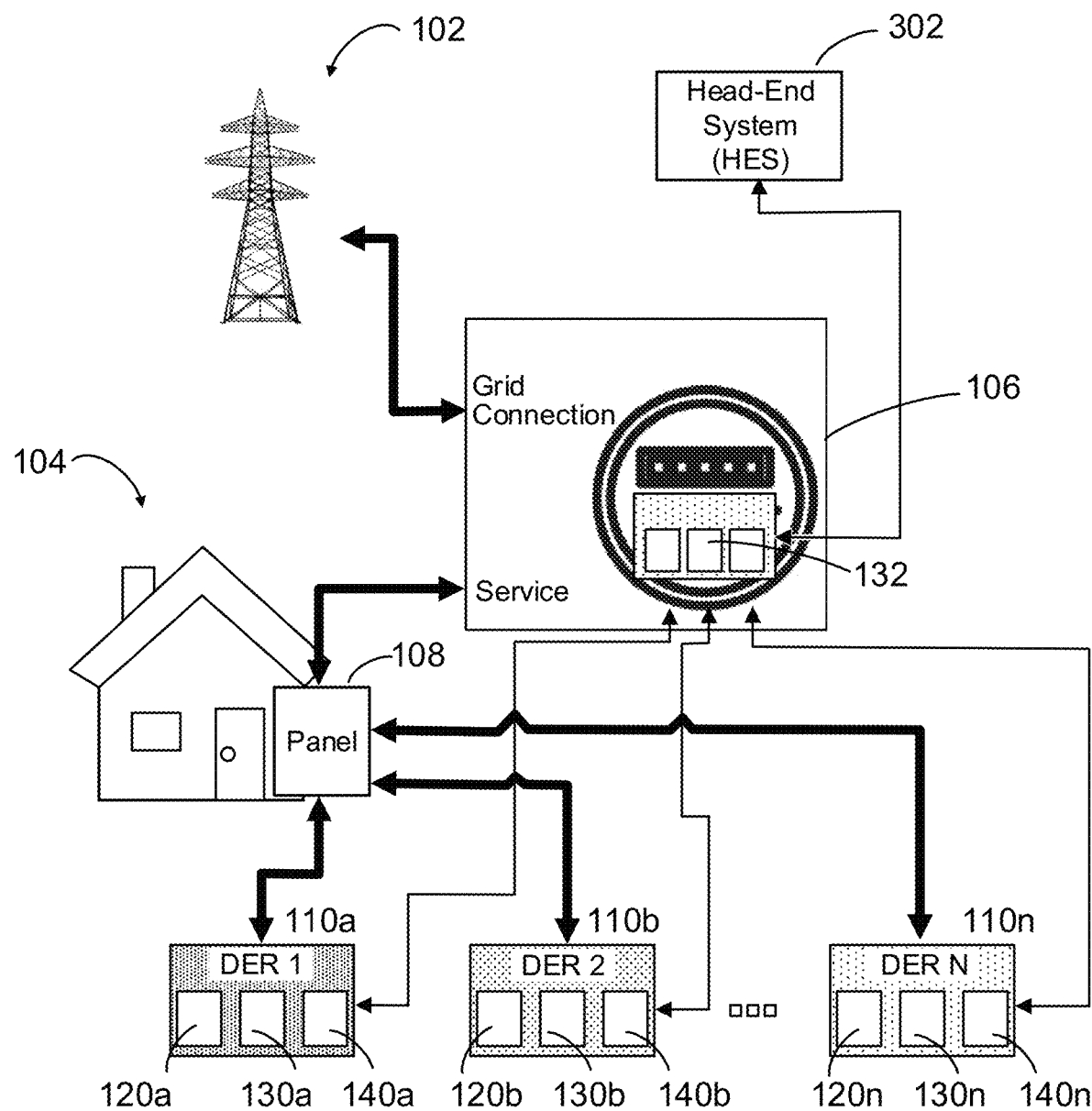
FIG. 3 is a block diagram illustrating a portion of an exemplary communications network for communications between a head-end system, a meter, and multiple DER devices.

In addition to the power connections shown in FIGS. 1 and 2, the meter and the DER devices are connected via one or more communications networks. FIG. 3 illustrates a portion of one exemplary communications network. The communications network includes communications channels between the meter 106 and DER devices 110a, 110b, 110n. Each of the communications modules in the DER devices communicates with the communications module in the meter. The communications channels may be wired or wireless and may use any type of communications protocol, including proprietary or non-proprietary protocols. One example is the Zigbee communications protocol. The communications modules in the DER devices may communicate information about the energy generated or supplied to the grid, as well as information about the status of the devices.

The communications module in the meter may receive commands or control instructions sent by the head-end system 302 and route the commands to the appropriate DER device. It may also receive communications from the DER devices and transmit the communications to the head-end system.

In addition to, or in the alternative to routing communications between the head-end system and the DER devices, the meter may generate commands and send them to the one or more of the communications modules in the DER devices. The meter may also receive information from the DER devices. The information may be provided to the head-end system and/or used by the meter.

In FIG. 3 all communications between a DER device and another device are routed through the meter at the same premises. The meter may communicate with the DER devices and with other devices on the communications network using the same network protocol or may use one network protocol to communicate with the DER devices and a different network protocol to communicate with the other devices on the communications network.

In some implementations, the meter receives information from the DER devices, aggregates the information, and then sends the aggregated information to the head-end system. In other implementations, the meter simply routes information received from the DER devices to the head-end system without aggregation.

As an alternative to the communications between the DER devices and the head-end system passing through the meter as shown in FIG. 3, one or more of the DER devices may be configured so that communications between the head-end system and the DER device pass through nodes other than the meter. For example, communications between the head-end system 302 and DER device 110a may be routed through a device on the network other than the meter 106 at the same premises.

Figure 4:
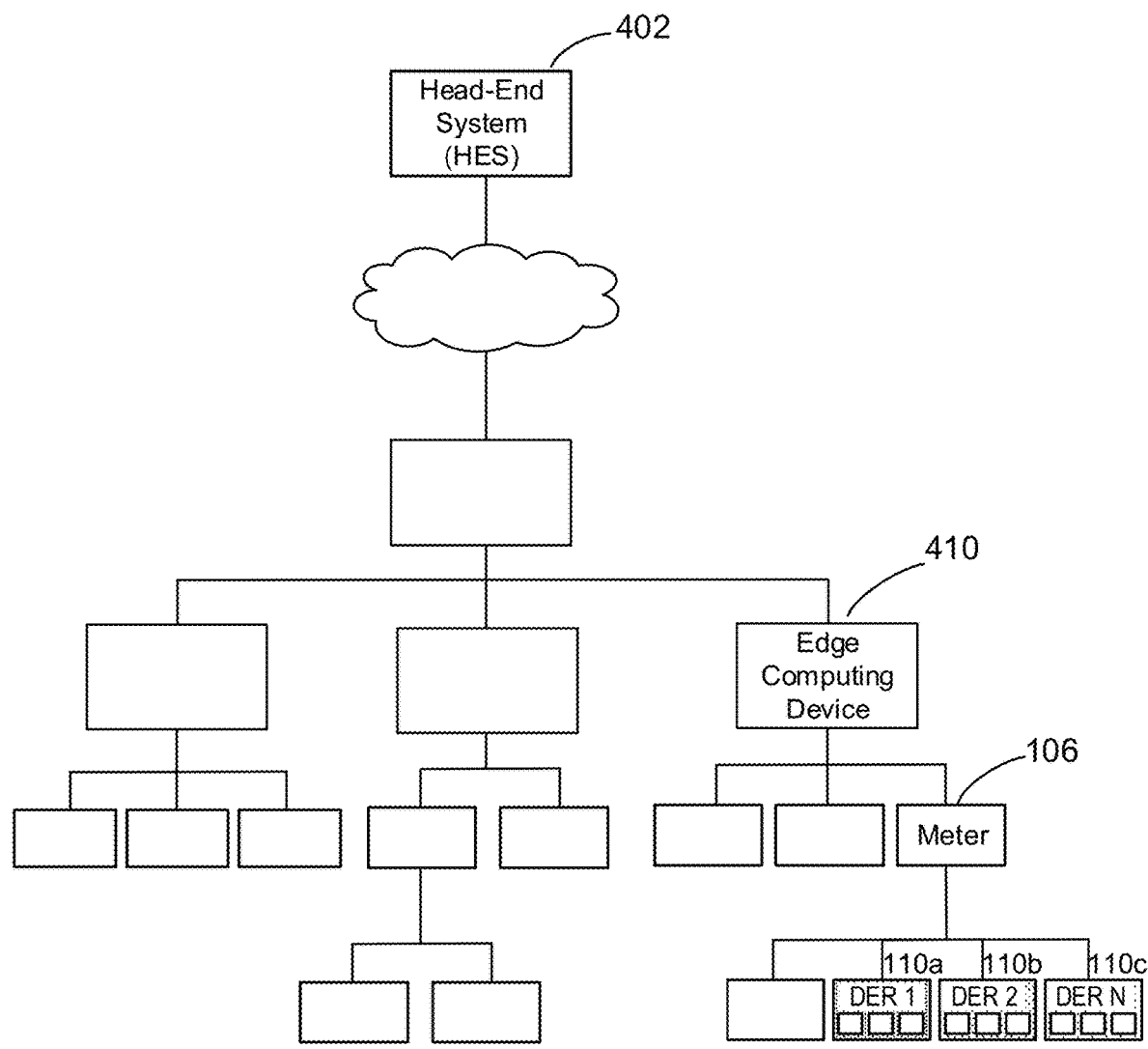
FIG. 4 is a block diagram illustrating a portion of an exemplary communications network topology for the communications network of FIG. 3.

In any of these examples, communications for other devices on the network may be routed through the meter 106. As shown in FIG. 4, the meter may be connected to a network of meters and other devices and communications between the head-end system 402 and the meter 106 may be communicated across multiple devices over one or more networks.

In some networks, the communications modules of the meter and/or the DER devices may communicate with a device that provides edge computing services. An edge computing service or edge computing device 410 may provide lower latency communication and control, since it is located topologically closer to the DER device on the communications network.

Communications Using a Gateway Device

Figure 5:
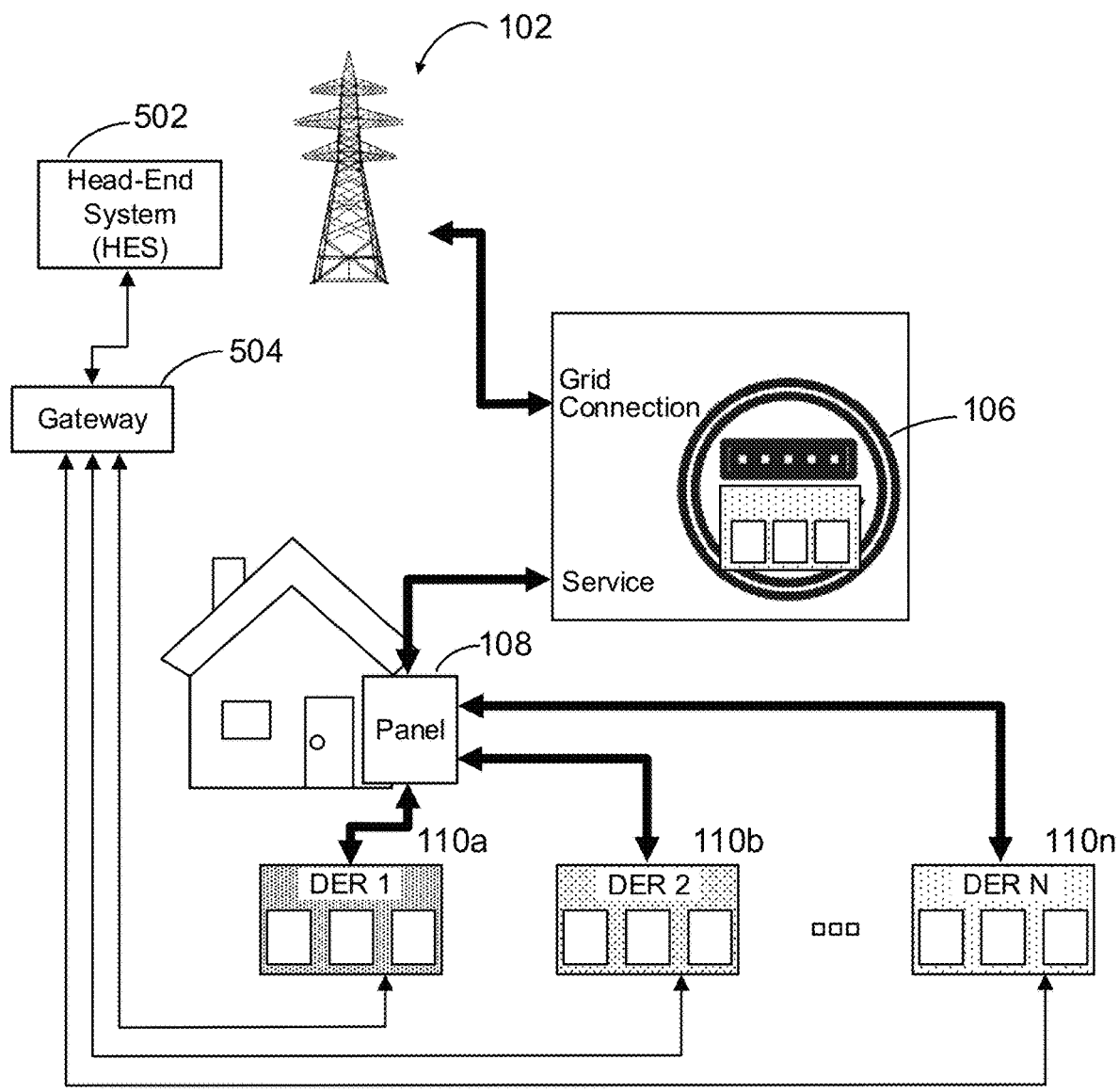
FIG. 5 is a block diagram illustrating a portion of an exemplary communications network for communications between a head-end system, a gateway device, a meter, and multiple DER devices.

FIG. 5 illustrates another exemplary communications network. In FIG. 5 the communications modules in the DER devices 110a, 110b, 110n communicate with a gateway device 504. The communications with the gateway device may use any type of communications protocol, including proprietary or non-proprietary protocols. Some examples are the Zigbee, Wi-Sun, or WiFi communications protocols. The communications modules in the DER devices may communicate information about the energy generated or provided to the grid, as well as information about the status of the devices.

Communications between the meter and the head-end system may not be routed through the gateway device. Instead, the meter may communicate with the head-end system as shown in FIG. 3 or may communicate with the head-end system over a PLC network. Alternatively, the meter may communicate via the gateway device.

The gateway device may be located at or near the premises. The gateway device communicates with the head-end system 502 through one or more networks. In addition to communications functions, the gateway device may be an edge computing device that provides edge computing services, such as services to support metering and control of the DER devices. The head-end system may communicate with the DER devices via communications routed through the gateway device.

In some examples, the gateway device 504 is located at the premises, such as a premises gateway device or home gateway device. The communications with premises gateway device 504 may use any type of communications protocol, including proprietary or non-proprietary protocols. Some examples are the Zigbee, Wi-Sun, or WiFi communications protocols. The communications modules in the DER devices may communicate information about the energy generated or provided to the grid, as well as information about the status of the devices.

The premises gateway device may be located at the premises. For example, a home gateway device may be located inside or outside a building located at the premises. The home gateway device communicates with the head-end system through one or more networks. In addition to communications functions, the premises gateway device may also provide edge computing services, including metering and control of the DER devices.

In an additional example, the gateway device 504 may be a cellular base station that communicates with the meter and the DER devices via a cellular network. The cellular network may be a public or a private cellular network. The communications modules in the DER devices may communicate information about the energy generated or provided to the grid, as well as information about the status of the devices.

The head-end system 502 communicates with the meter and with the DER devices via the cellular base station gateway device 504. Although not shown in FIG. 5, communications between the cellular base station and the head-end system may use additional networks and network devices. As an alternative to the communications module of the meter communicating through the cellular base station, the meter may communicate with the head-end system using a different network than that used by the DER devices.

Edge Computing Devices for Controlling Loads and DER Devices

Figure 6:
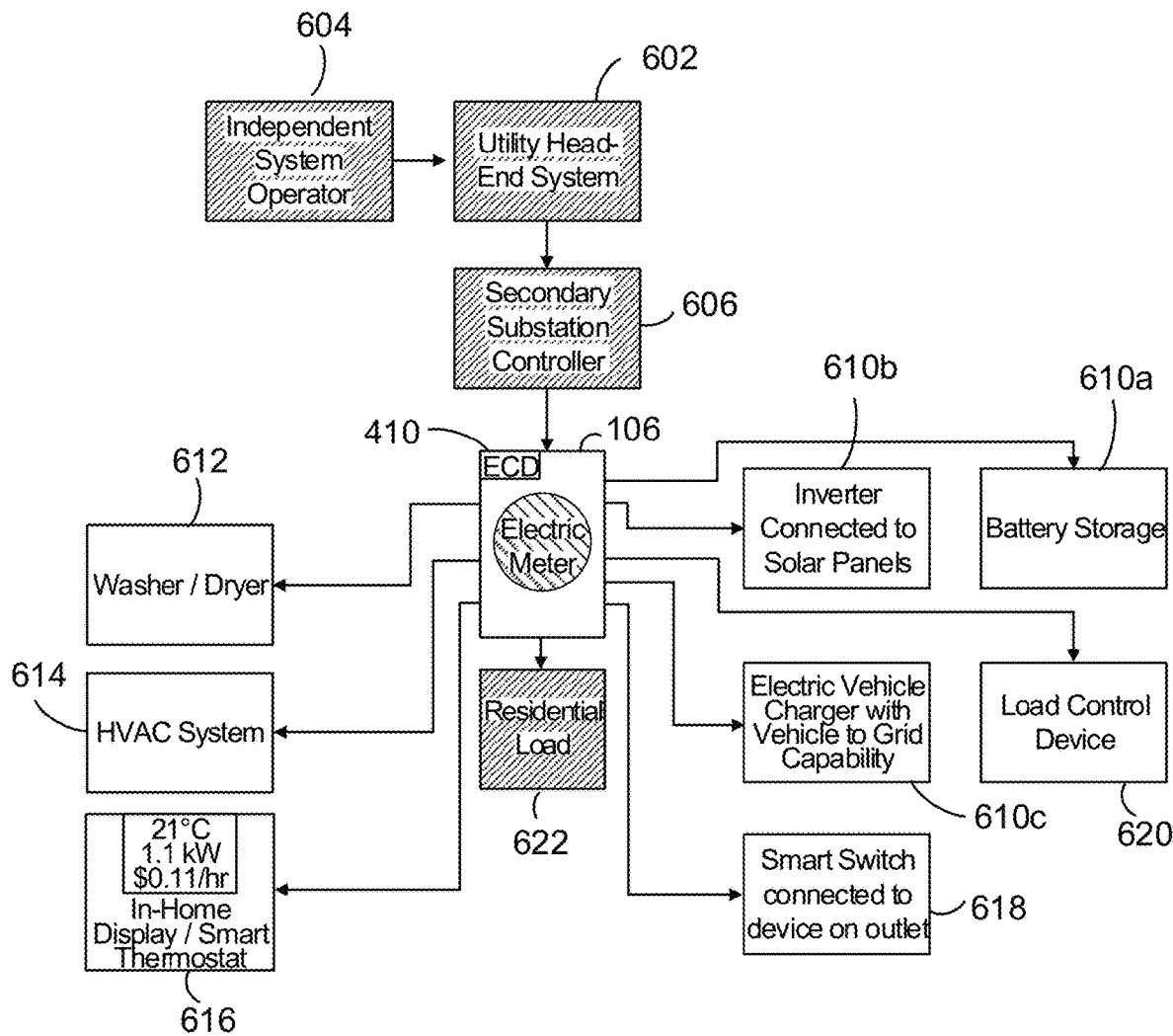
FIG. 6 is a block diagram illustrating a portion of an exemplary communications and control network for communications between a head-end system, an independent system operator, a meter, and multiple DER and load devices that are metered by the meter.

FIG. 6 is a block diagram illustrating a portion of an exemplary communications and control network for communications between a head-end system 602, an independent system operator 604, a meter 106, and multiple DER and load devices that are metered by the meter 106. Communication between the components depicted in FIG. 6 may be performed using any of the techniques described above with respect to FIGS. 1-5. As depicted, the electric meter 106 includes multiple ports for electrically coupling, communicatively coupling, or both electrically and communicatively coupling the electric meter 106 to the DER and load devices. For example, the electric meter 106 may include ports for a battery storage device 610a, an inverter 610b that is coupled to solar panels, an electric vehicle (EV) charger 610c that is connected to an EV, a washer/dryer 612, an HVAC system 614, an in-home display or smart thermostat 616, a smart switch 618 connected to a device at an outlet, or any other residential load devices 622. In an example, the electric meter 106 may be able to monitor each of the coupled devices and provide control commands to control the connection of the devices to the grid 102. Although FIG. 6 includes one electric meter 106, there may be multiple electric meters connected to a distribution transformer associated with the secondary substation, each meter coupled to its own set of loads.

For example, a distribution transformer associated with a secondary substation controller 606 can become overloaded if multiple electric vehicles chargers 610c, which are located downstream from the distribution transformer, begin charging simultaneously. To prevent overloading of the distribution transformer, distributed intelligence, such as commands generated by the edge computing device 410 and distributed to networked devices, can be used to manage charging of the multiple electric vehicles or other battery storage devices 610a by reducing duty cycles of the power provided to the electric vehicles chargers 610c or battery storage devices 610a or by reducing a charge level of the individual electric vehicles or the battery storage devices 610a to manage the overall demand.

When there are multiple meters with edge computing devices connected downstream of the same secondary substation, there may be communication and coordination between the edge computing devices to manage the devices connected to each meter. One option is to have one of the edge computing devices act as a master device. Another option is to have each edge computing device independently make its own determinations and then communicate the determinations to the other edge computing devices so that an edge computing device may consider actions taken or to be taken by other edge computing devices when determining its own actions.

In some examples, the demand on the distribution transformer may be forecast by machine-learning algorithms run on the edge computing device 410 located at the meter 106 or on a remote system, such as the secondary substation 606 or head-end system 602. For example, the machine-learning algorithm may learn, over time, power consumption trends for devices that are downstream from the secondary substation controller 606, which includes the potentially overloaded distribution transformer. Inputs to the machine-learning algorithm may include, but are not limited to, current and historical energy demand, time of day, day of week, day of year, geographical location, current and forecasted weather conditions, historical generation by a downstream DER device, transformer and equipment ratings, a model of the distribution system or a portion of the distribution system that includes the distribution transformer, and flexible load factors. Flexible load factors relate to load that may be shed or load that is forecasted to be shed. As the power consumption trends are learned, the edge computing device 410 may generate control commands for devices during time periods that may stress the distribution transformer. In an example, the control commands may involve controlling charging rates of the electric vehicles chargers 610c or the battery storage devices 610a or controlling the application of power to the grid 102 from electric vehicles, the battery storage devices 610a, and the inverter 610b. Other control commands may also be implemented to reduce or increase the energy consumption downstream from the distribution transformer by controlling non-critical loads on or off, discharging storage devices (e.g. battery storage device or EV), or to increase energy consumption of flexible loads (e.g. battery storage device or EV). For example, the control commands may involve commands to open or close circuit breakers to electrically decouple or couple the DER devices with the grid 102 or other on-premises loads, as described above with respect to FIG. 2.

In an example, the electric vehicles chargers 610c and other DER devices (e.g., the battery storage 610a and the inverter 610b connected to the solar panels) can create a significant phase imbalance on the multi-phase power systems provided by the grid 102, such as when several of the electric vehicles begin charging at once or when the output of a solar device peaks during peak solar hours. The distributed intelligence can assist with charging and discharging timing of the DER devices 610a-610c to provide balancing effects on the load across the phases. In an example, machine-learning techniques may learn over time power consumption trends for devices that are downstream from the secondary substation controller 606 that result in phase imbalances. For example, as the power phase-imbalance trends are learned, the edge computing device 410 may generate control commands for devices operating on various phases of the grid 102 during forecast periods of time where a phase imbalance is expected. In an example, the control commands may involve controlling charging rates of the electric vehicles or the battery storage devices 610a or controlling application of power to the grid from the battery storage devices 610a, the inverter 610b, or the electric vehicles. Other control commands may also be implemented to balance the loads on the phases downstream from the distribution transformer.

Because the machine-learning techniques enable automatic decision making based on load demand, user involvement that results in inefficiencies and inaccuracies may be avoided. Further, the machine-learning techniques may provide predictive and preventive recommendations to avoid negative impacts on the grid, such as overloading of the distribution transformer.

In additional examples, a demand curve of the grid 102 combined with a supply curve of solar production from the inverter 610b and other factors can lead to large variability in energy generation required. Using distributed intelligence and control may provide a mechanism to smooth the supply and demand curves, which may reduce overall energy production costs. The demand and supply curves may relate to an area of any size, from an entire territory to a micro-grid. The ISO 604 or the edge computing device 410 may forecast energy production costs over time periods. The energy production costs may be based on a load demand experienced by the grid 102 during the time periods. In an example, the supply and demand curves may be smoothed by performing operations that take advantage of low energy costs during low-cost time periods, such as by charging the electric vehicles and the battery storage 610a, and reducing consumption during high-cost time periods, such as by selling energy to the grid 102 by discharging the electric vehicles and the battery storage 610a using a vehicle-to-grid system and selling other available power from other DER devices to the grid 102. In some examples, forecasting the energy production costs may minimize the use of non-renewable energy by maximizing the usage of producible solar power.

Such a technique may address the inefficient use of energy by end consumers that typically results in higher overall energy cost and higher carbon emissions. This technique may pass along the true cost of energy production to provide an incentive to customers to sell energy when needed by the grid 102 (e.g., during the high-cost time periods), and to consume energy at the optimal times for the grid 102 (e.g., during the low-cost time periods). This technique may also provide utilities with the option to directly control energy use for the same purpose.

In some examples, the DER devices can also address impacts of highly reactive loads and generators by regulating voltage on the grid 102. For example, when a highly reactive load begins consuming power from the grid 102, the edge computing device 410 may provide commands to DER devices coupled to the grid 102 through the meter 106 to discharge so that the voltage on the grid 102 is maintained at a desired level. The edge computing device may detect the presence of a highly reactive load by monitoring reactive power consumption or total harmonic distortion. In an example, several electric vehicle charging stations may be aggregated as a source for voltage regulation when the electric vehicles with sufficient charge are electrically coupled to the charging stations.

Additionally, these device control systems can provide intelligence for smart home demand management to prevent excessive demand charges (e.g., by reducing demand during high-cost time periods), provide real-time load monitoring, provide energy and bill forecasting, and provide alerts related to power consumption and associated costs. In some examples the edge computing device 410 may automatically provide control commands to individual devices to stop operating or to modify their operation when an overload condition is expected. For example, the washer/dryer 612, the HVAC system 614, the smart thermostat 616, a smart switch 618, and a load control device 620 may each be capable of receiving control commands to prevent or limit operation during peak demand time periods. In some examples, a customer may agree to this direct control of the various household devices in exchange for a lower overall unit cost of power consumption.

Exemplary Techniques for Controlling a Load or a DER Device

The inclusion of communications modules in DER devices and other load devices and the connection of the DER devices and the other load device to a communications network, as described above, support improved control and connection of the devices.

Figure 7:
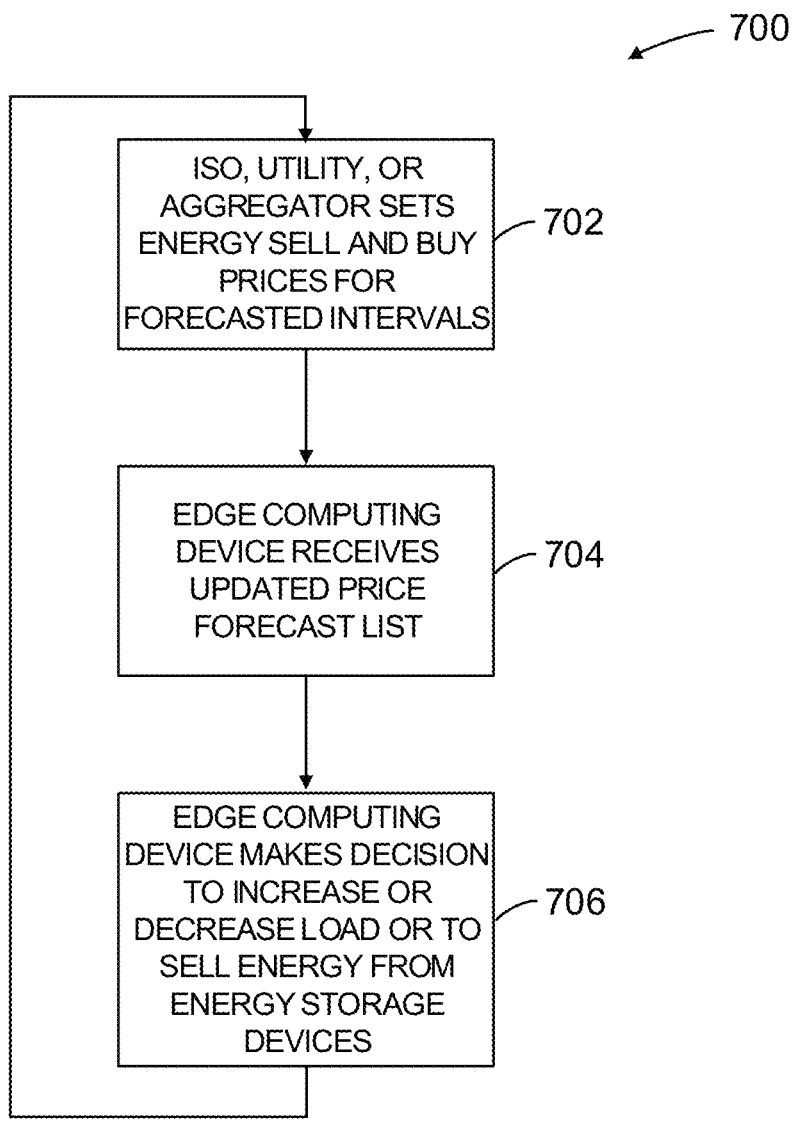
FIG. 7 is a flow diagram illustrating an exemplary method for controlling a load device or a DER device on an electric distribution network.

An exemplary method 700 of controlling a DER device, such as an electric vehicle or an energy storage device, or a load is shown in FIG. 7. At block 702, the method 700 involves the ISO 604, the utility head-end system 602, or an energy aggregator determining energy sell and buy prices for forecasted intervals. The ISO 604, the head-end system 602, or the energy aggregator may use machine-learning techniques to learn historical demand cycles, weather conditions, and other factors that contribute to energy generation costs and leverage those historical factors to set the energy prices for the forecasted intervals. Inputs to the machine-learning algorithm may include current and historical energy demand, time of day, day of week, day of year, geographical location, and other factors relevant to how premises may consume energy. In some examples, the intervals may be set as five minute blocks of time where prices change on the boundaries between the intervals. Shorter or longer intervals may also be used. The prices may be forecast or set for an extended number of intervals. For example, the prices may be forecast for a day, several days, weeks, etc. to provide the edge computing devices 410 with the ability to map cost-effective use of load devices coupled to the grid 102.

At block 704, the method 700 involves the edge computing devices 410 receiving the price forecasts from the ISO 604 or the head-end system 602. Other devices and users may also receive the price forecasts. For example, consumers, electric vehicle chargers, photovoltaic inverters, battery storage systems, and other devices that are controllable in response to the price forecasts may also receive the price forecasts.

At block 706, the method 700 involves the edge computing devices 410 making determinations to increase or decrease energy received at the loads or to sell energy from energy storage and generation devices, such as electric vehicles, battery storage systems, solar power inverters, solar power battery storage systems, and wind turbines. The edge computing devices 410 may also predict the loads at the premises associated with the edge computing devices 410 based on factors such as weather, historical load, time of day, day of week, etc. The edge computing device may generate a load forecast for a specific time period. The period of time used by the edge computing device may, but is not required to be the same as the interval used in block 704. Additionally, the edge computing devices 410 may use historical pricing trends to predict future pricing beyond the forecasted amounts generated by the ISO 604, the utility head-end system 602, or the energy aggregator. Alternatively, the edge computing device may generate its own price forecast based on the received price forecast.

In some examples, the edge computing devices 410 transmit control commands to the load devices based on the price and load forecasts. For example, at a low-cost time interval, the edge computing devices 410 may send control commands to electric vehicle chargers and battery system chargers to begin charging. At high-cost time intervals, the edge computing devices 410 may send control commands to the electric vehicle chargers and the battery system chargers to use a vehicle-to-grid system to sell energy back to the grid 102 or to supply energy to the premises associated with the electric vehicles and the battery systems. Additionally, the edge computing devices 410 may control demand-response devices, such as pool pumps, washing machines, HVAC systems, etc. to operate normally using normal operating parameters during low-cost time intervals and to operate in a reduced manner using energy-saving operating parameters during high-cost time intervals. The edge computing device may consider user inputs or commands when controlling the load devices. A user may specify that a device is to remain powered during certain time periods or that a device is to be charged to a certain level by a certain time. The user may also allow consumption during high-cost time intervals for certain devices or under certain conditions.

The edge computing devices 410 may include the ability to directly control the actions listed above and other actions that affect load totals and that provide energy back to the grid. These actions may impact system peak demand, voltage regulation, and system balancing, among other impacts. In some examples, the control commands can come directly from the utility head-end system 602 or local controllers, such as at the secondary substation controller 606. In an example of a hierarchical system, a head-end system may send a command to a secondary substation that specifies an amount of energy that needs to be reduced or is available. The secondary substation may send other commands to edge control devices downstream of the substation based on the command received from the head-end system, as well as other factors, such as available energy, instantaneous power, and the grid topology. The edge control devices may control loads based on the command received from the substation, as well as other factors. Additionally, users, utilities, or both may have the ability to change or override the way the edge computing devices 410 control loads. Further, the meter 106 may include load disaggregation that enables more accurate load forecasts to provide more efficient granularity for load control. Once control commands are provided by the edge computing devices 410, the method 700 may return to block 702 for further price forecasting for additional time intervals.

In an additional example, a utility or a controlling group, such as an energy aggregator, may enter an agreement with a consumer to control load devices based on prices generated by the ISO 604. The ISO 604 may set prices for five-minute intervals or other time interval lengths. The controlling group may determine an amount of energy available and an optimal time to sell or use the energy based on the prices from the ISO 604. Based on this determination, the controlling group may bid a certain amount of energy for a specific time interval based on energy availability and set prices. The controlling group sends commands that enable energy flow from individual energy storage devices back to the grid 102 at the desired times based on the energy bids. In some examples, the controlling group may also send commands for deferred loads, such as pool pumps and HVAC systems, based on the bids.

Monitoring and control of DER loads, such as electric vehicles and battery storage systems, enables the offering of a service to utilities to manage charging or other energy consumption by the DER loads to spread out the load over time to ensure a relatively flat load curve. In an example, a neighborhood with multiple electric vehicles charging at a fastest charging rate may create a spike in the load curve and may overload a local substation. By managing the charging of the electric vehicles, such as slowing down the charge or reducing the number of electric vehicles charged simultaneously, allowable load levels may be drawn from the substation.

Using Multiple Edge Computing Devices to Control Loads and DER Devices

Figure 8:
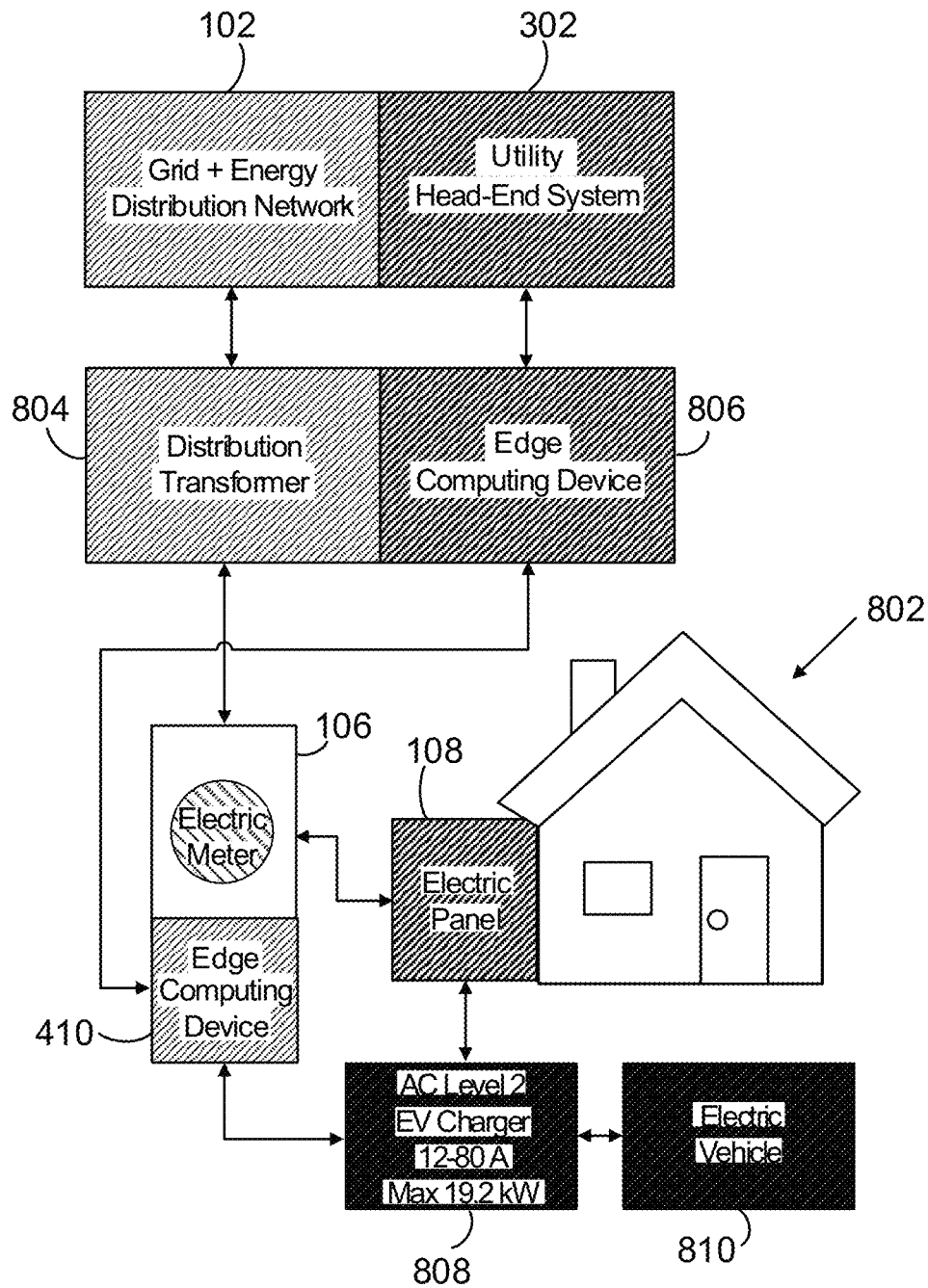
FIG. 8 is a block diagram illustrating exemplary power and communication connections between an electric distribution network, a meter, a panel located at a premises, and one or more DER devices.

FIG. 8 is a block diagram illustrating exemplary power and communication connections between an electric distribution network, a meter, a panel located at a premises, and one or more DER devices. As shown, the grid 102 provides electricity to a premises 802 through a distribution transformer 804, the electric meter 106, and the electrical panel 108. The distribution transformer may operate in a manner similar to the secondary substation controller 606 of FIG. 6. Communications may be provided from the utility head-end system 302, to an edge computing device 806 at the distribution transformer 804, and to the edge computing device 410 at the electric meter 106.

In some examples, pricing forecasts may be determined using machine-learning techniques at the edge computing device 806 of the distribution transformer 804 and then provided to the edge computing device 410 at the electric meter 106. For example, the edge computing device 410 may control a DER device, such as an electric vehicle charger 808 of an electric vehicle 810 based on the pricing forecast received from the edge computing device of the distribution transformer. In some examples, the edge computing device 806 may directly communicate and control a DER device connected to an electric meter. If so, then the electric meter may not require its own edge computing device.

In an additional example, the edge computing device 806 at the distribution transformer 804 may be removed. In such an example, the edge computing device 410 at the electric meter 106 may perform operations previously performed at the distribution transformer 804. Additionally, the electrical panel 108 may be bypassed by the electric vehicle charger 808 in an example where the electric meter 106 is a multi-port meter capable of directly metering energy consumed or output by the electric vehicle charger 808.

Further, communication may be provided directly from the head-end system 302 to the electric vehicle charger 808 in an example where both the head-end system 302 and the electric vehicle charger 808 are communicatively coupled to a data network. In some examples, both the electric meter 106 and the head-end system 302 are capable of direct communication with the electric vehicle charger 808. While FIG. 8 depicts the electric vehicle charger 808 and the electric vehicle 810, other examples may include an inverter coupled to battery storage. In some examples, the inverter, the battery storage, or both may be coupled to solar panels at the premises.

Figure 9:
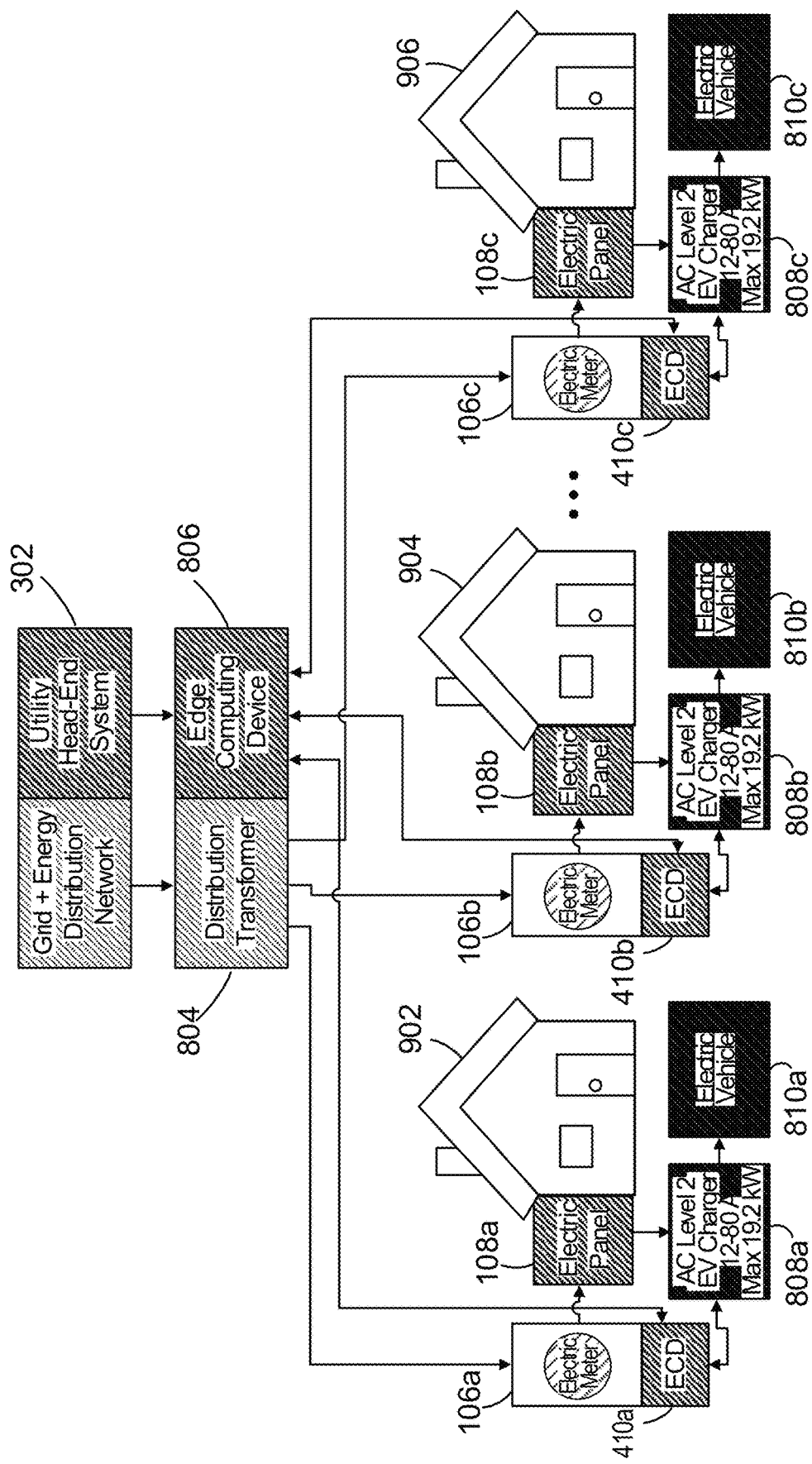
FIG. 9 is a block diagram illustrating exemplary power and communication connections between an electric distribution network and multiple premises including DER devices.

FIG. 9 is a block diagram illustrating exemplary power and communication connections between an electric distribution network and multiple premises including DER devices. In some examples, the edge computing device 806 may provide general information, such as dynamic peak pricing (i.e., pricing forecast information determined by an edge computing device associated with a distribution transformer), to each of the premises 902, 904, and 906. The edge computing devices 410a, 410b, and 410c, may use the general information to determine more granular commands at the premises 902, 904, and 906. For example, the edge computing devices 410a, 410b, and 410c may generate control commands for the electric vehicle chargers 808a, 808b, and 808c based on the dynamic peak pricing indication received from the edge computing device 806 of the distribution transformer.

In an example, a controlling device, such as the edge computing device 806 at the distribution transformer 804 or at the utility head-end system 302, may also monitor the loading of the distribution transformer 804. With the proliferation of electric vehicles 810 requiring a large amount of current to charge, the simultaneous charging of the electric vehicles 810a, 810b, and 810c at every premises 902, 904, and 906 under the distribution transformer 804 could cause an overload of that distribution transformer. To prevent an overload, the controlling device monitors an overall load and an individual premises load, including the load of the electric vehicle chargers 808a, 808b, and 808c, through the multi-port meters 106a, 106b, and 106c, through communications directly with the electric vehicle chargers, or through load disaggregation of the premises. The controlling device can use weather, historical load and generation data, time of day, day of week, geographic location, and other factors to forecast the load. If the forecast is above a specified threshold (e.g., 80% of distribution transformer capacity) the controller can send commands to some or all end devices, such as the meters 106a, 106b, and 106c, that would then control the electric vehicle chargers 808a, 808b, and 808c through direct control, such as a cutoff command, a command to reduce the charging rate, or a command to prevent the start of a charge. The direct control from the end devices may reduce the charging rate of the electric vehicles 810a, 810b, and 810c or the EV chargers 808a, 808b, 808c below a specific charging rate level (e.g., 10%, 50%, 90%, etc.) or cease charging the electric vehicles 810a, 810b, and 810c.

In addition to using forecasted load to control the electric vehicles 810a, 810b, and 810c, the controlling device may also use the value of the instantaneous demand to determine what level of control is needed for the electric vehicles. This allows the controlling device to respond to a situation where the distribution transformer 804 is approaching its limit or is over its limit.

In an additional example, the edge computing device 806 at the distribution transformer 804 may be removed. In such an example, the edge computing devices 410*a*, 410*b*, and 410*c* at each of the residences 902, 904, and 906 may perform operations previously performed at the distribution transformer 804. Additionally, the electrical panels 108*a*, 108*b*, and 108*c* may be bypassed by the electric vehicle chargers 808*a*, 808*b*, and 808*c* in an example where the electric meters 106*a*, 106*b*, and 106*c* are multi-port meters capable of directly metering energy consumed or output by the electric vehicle chargers 808*a*, 808*b*, and 808*c*. In an example where the edge computing device 806 is removed, the head-end system 302 may generate and provide the general information to the edge computing devices 410*a*, 410*b*, and 410*c*.

Further, communication may be provided directly from the head-end system 302 to the electric vehicle chargers 808*a*, 808*b*, and 808*c* in an example where the head-end system 302 and the electric vehicle chargers 808*a*, 808*b*, and 808*c* are communicatively coupled to a data network. Additionally, while FIG. 9 depicts the electric vehicle chargers 808*a*, 808*b*, and 808*c* and the electric vehicles 810*a*, 810*b*, and 810*c*, other examples may include inverters coupled to battery storage systems. In some examples, the inverters, the battery storage systems, or both may be coupled to solar panels at the premises.

Using an Aggregator and Control Device to Control Power Quality

Figure 10A:
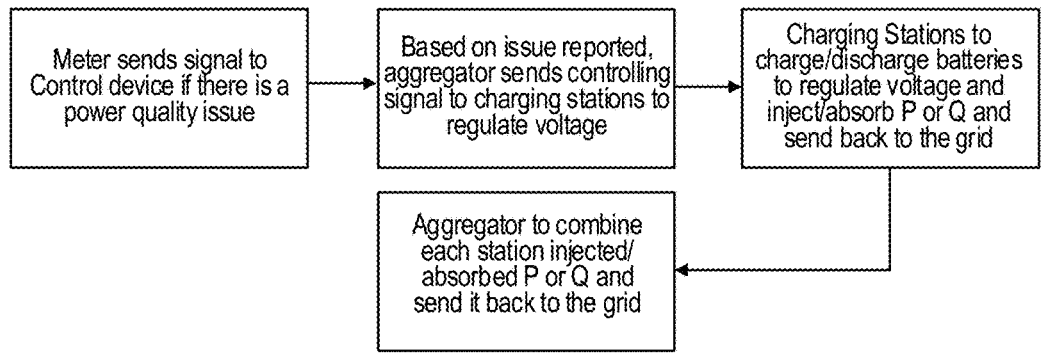
FIG. 10A is a block diagram illustrating exemplary operations of an aggregator and control device.
Figure 10B:
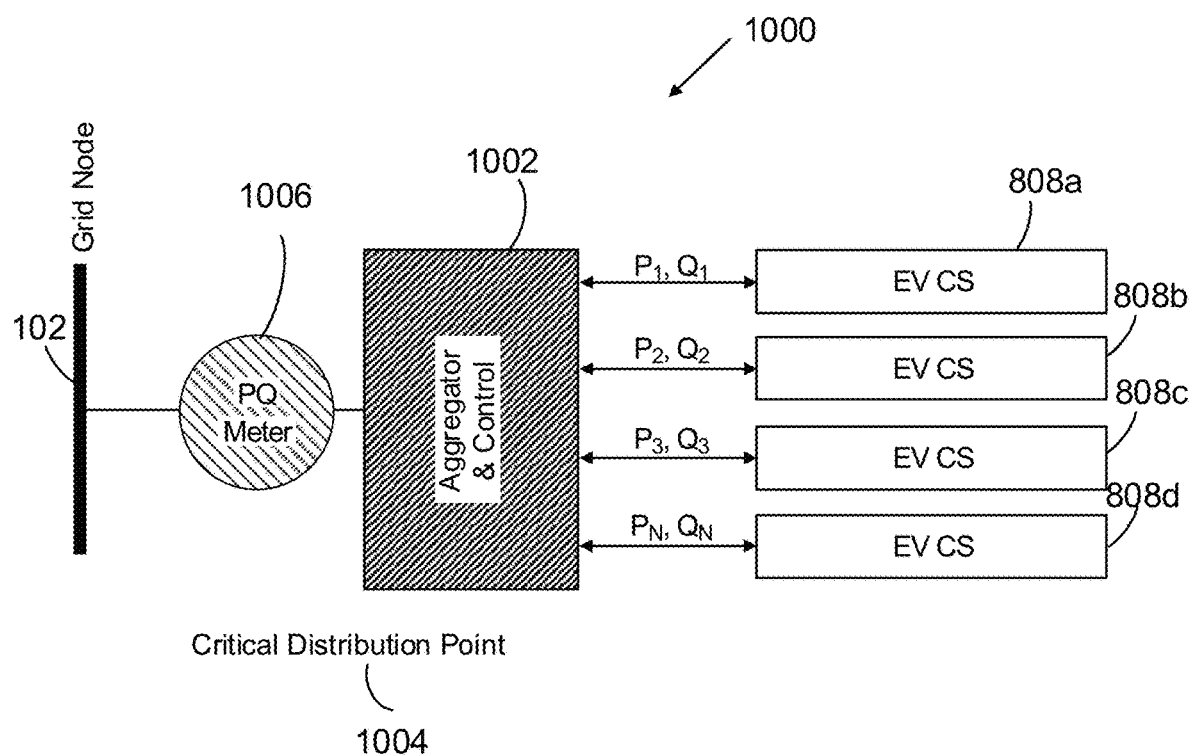
FIG. 10B is a block diagram of an exemplary system used to regulate voltage on the grid using an aggregator and control device.

FIGS. 10A and 10B illustrate how an edge control device may control power quality. FIG. 10B is a block diagram of a system 1000 used to regulate load control and pricing at a critical distribution point 1004 on the grid using an aggregator and control device 1002 that includes edge software. The critical distribution point may correspond to a secondary substation or a distribution transformer. The aggregator and control device controls an aggregate of loads and distributed energy resources to optimize various outputs. When implemented as software, the aggregator and control device 1002 utilizes artificial intelligence and machine learning with inputs of weather, time of day, date, historical demand and energy production, and geographical location and outputs of control in the form of pricing changes or direct control. The outputs are sent to the electric meters downstream of the critical distribution point. The aggregator and control device 1002 may also monitor power quality, such as voltage stability, at a critical distribution point 1004, such as a distribution transformer located between the grid and the power quality meter 1006. The aggregator and control device may be part of power quality meter 1006.

In an example, the aggregator and control device 1002 may use weather, historical load and generation data, time of day, day of week, geographic location, real-time power quality metering of the grid 102 by a real power and reactive power (PQ) meter 1006, and other factors to forecast load and power quality, including active and reactive power and voltage, and regulate voltage accordingly. If the aggregator and control device 1002 determines that adjustments to the power quality of the grid are desirable, the aggregator and control device 1002 may send commands to end devices, such as meters 106 in communication with electric vehicle charging stations 808*a*, 808*b*, 808*c*, and 808*d*, to reduce charge below a specific level (e.g., 10%, 50%, 90%, etc.), to cease charging, to start providing energy back to the grid, or to control real and reactive power needed to regulate voltage. The aggregator and control device 1002 may receive indications of real power P injected by the electric vehicle charging stations 808*a*, 808*b*, 808*c*, and 808*d* to the grid 102 and any reactive power Q absorbed from the grid 102 by the electric vehicle charging stations 808*a*, 808*b*, 808*c*, and 808*d*.

FIG. 10A illustrates a method for controlling EV charging stations to address power quality issues. A power quality meter 1006 may detect a power quality issue and communicate the issue to a control device, such as aggregator and control device 1002. The aggregator and control device controls the EV charging stations 808*a*-808*d* by sending control signals to the charging stations to make adjustments to address the power quality issue. In response to receiving the control signal, each EV charging station may charge or discharge a connected EV battery. The control signals sent to the EV charging stations may request different actions by different EV chargers. The aggregator and control device combines the outputs from the EV chargers and send the outputs to the grid to control real and reactive power at the grid node.

Exemplary Machine-Learning Models

There may be multiple machine-learning models operating in the systems described above. The models may include, but are not limited to, a model for generating price interval data that operates at the head-end system or the secondary substation, a model for generating future pricing data that operates at the electric meter, and a model for controlling loads and DER devices that operates at the meter.

The models that generate pricing data forecast energy prices and may be implemented using a regression model. Both linear and non-linear regression models may be used. Each regression model may be trained and validated using a data set. The data set is based on pricing data collected from prior time periods across a variety of conditions, dates and times. The conditions, dates and times may be used to define the model inputs and the historical prices may be used to define the model output. The data set used for a model that operates at an electric meter may differ from the data set used for a model that operates at a head-end system or at a secondary substation. The data for a model that operates at the electric meter may include meter-specific data. The meter-specific data may include temperature information related to the meter or the premises instead of temperature information for a wider geographical area.

The data set is divided into a training data set and a validation data set. The training data set is used to train the regression model and the validation data set is used to validate the trained model. During training and validation, the weights used in the model are adjusted until the model provides an acceptable level of accuracy. Options to measure the accuracy of the model include determining the percentage of intervals that the model correctly predicts the price or the percentage of intervals that the model predicts the price within an acceptable tolerance. Once the model is validated, it may be deployed to the edge computing devices. The performance of the deployed model is monitored and additional data is collected, so that the model may be retrained using a new data set, as desired. The retrained model may then be deployed to replace the original model.

A model that controls loads and DER devices, may use a training set that includes different types of data than the data used with a model that predicts pricing. The data set may be based on control data collected from prior time periods across a variety of conditions, dates and times. The data may include, but is not limited to, data related to specific types of loads or DER devices.

Figure 14:
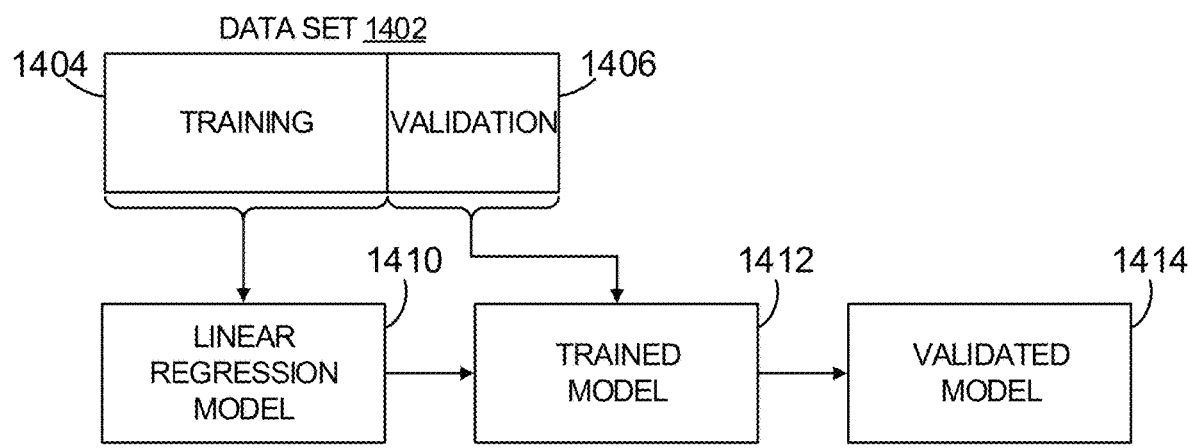
FIG. 14 is a diagram illustrating the training and validation of an exemplary machine-learning model.

FIG. 14 illustrated an exemplary method for training and validating a linear regression model for predicting pricing that may be used for generating price interval data or future pricing data. Data set 1402 includes a training data set 1404 and a validation data set 1406. The training data set is used to train linear regression model 1410. Once a trained model 1412 is available, the validation data set is used to validate the trained model. The process to train and validate the model includes a number of additional steps that are not shown in FIG. 14, such as adjusting the weights used in the model to improve the accuracy of the price output during both training and validation. Once the model is validated, it may be deployed.

Edge Computing Devices and Multi-Port Meters

Figure 11:
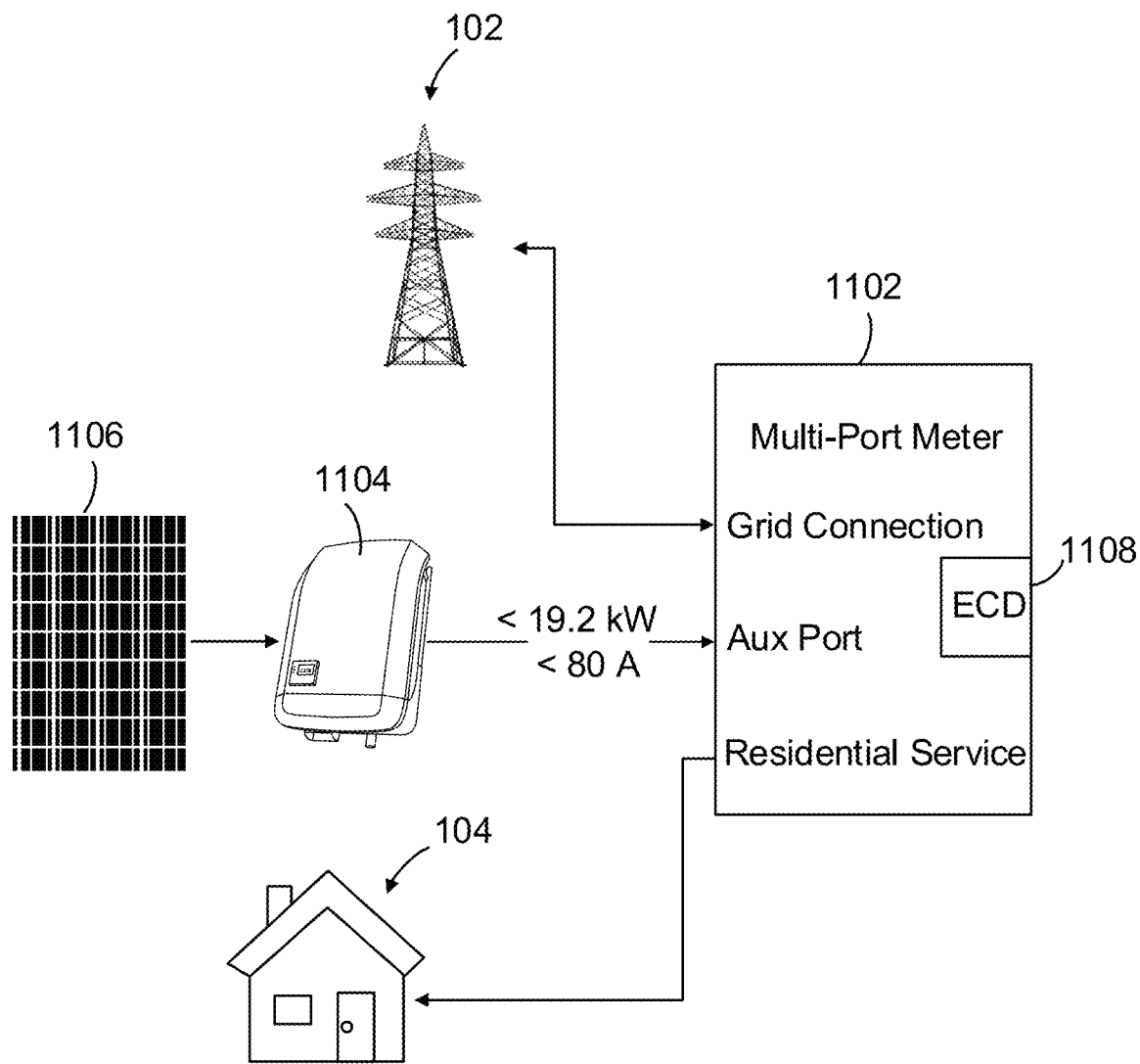
FIG. 11 is a block diagram illustrating an exemplary arrangement of a multi-port meter electrically coupled to a solar inverter.

FIG. 11 is a block diagram illustrating an arrangement of a multi-port meter 1102 electrically coupled to a solar inverter 1104. The solar inverter 1104 receives DC power from a photovoltaic solar panel 1106. The solar inverter 1104 converts the DC power to generate AC power that is provided to the multi-port meter 1102. The multi-port meter 1102 can apply the AC power from the solar inverter 1104 to the grid 102 or to the premises 104. In an example, the multi-port meter 1102 may receive instructions from an edge computing device 1108, for example, to shed energy production from the solar inverter 1104 if required. The metrology of the solar inverter 1104 may occur through the multi-port meter 1102. Additionally, the edge computing device 1108 may be located in the multi-port meter 1102 to make edge decisions regarding control of distributed energy resource devices, such as the solar panels 1106, that are electrically coupled at the multi-port meter 1102 through the solar inverter 1104.

Figure 12:
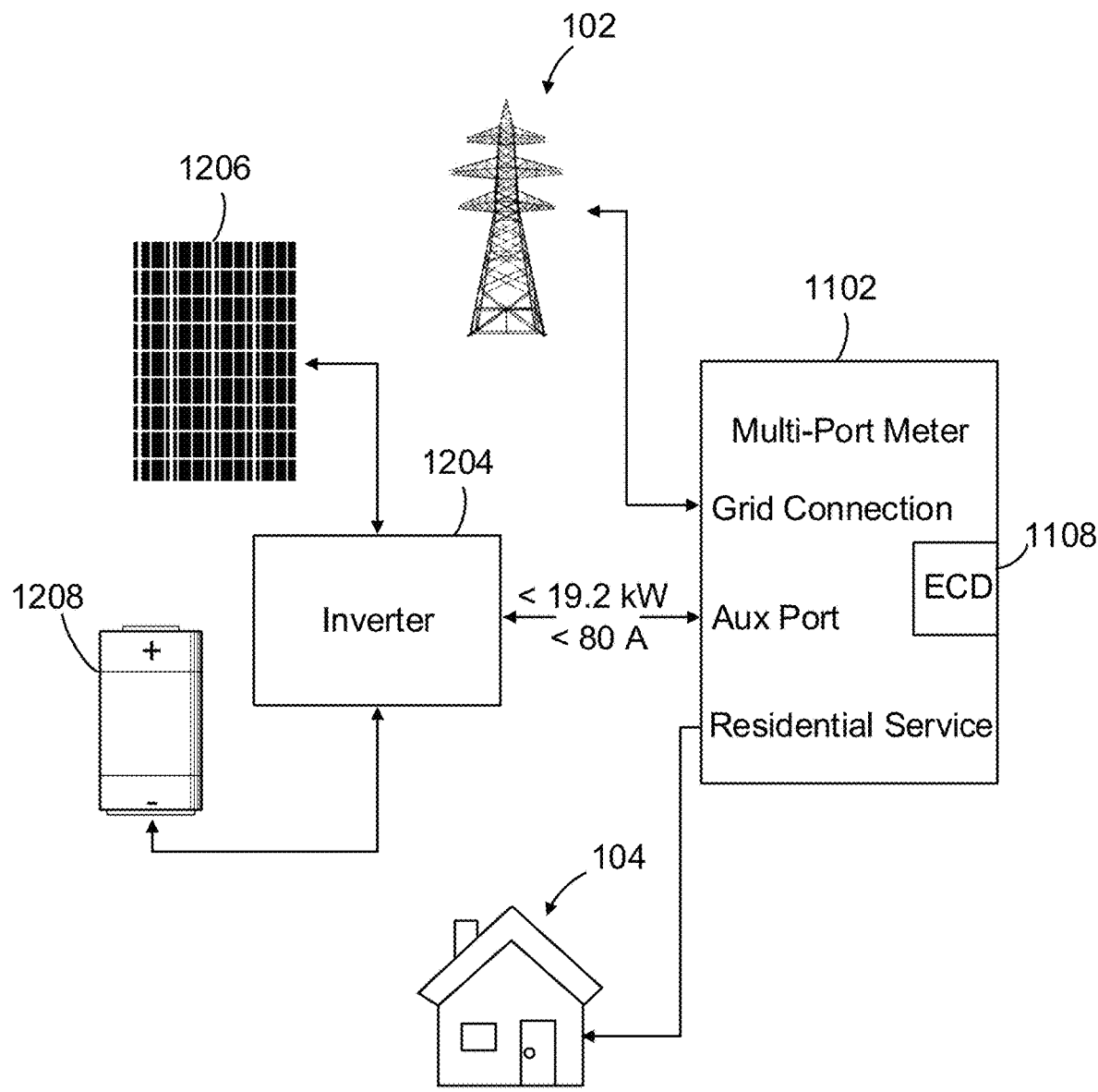
FIG. 12 is a block diagram illustrating an exemplary arrangement of a multi-port meter electrically coupled to an inverter for solar panels, a battery storage, or both.

FIG. 12 is a block diagram illustrating an arrangement of the multi-port meter 1102 electrically coupled to an inverter 1204 for solar panels 1206, a battery storage 1208, or both. The inverter 1204 receives DC power from a photovoltaic solar panel 1206 or a battery storage system 1208. The inverter 1204 converts the DC power to generate AC power that is provided to the multi-port meter 1102. The multi-port meter 1102 can apply the AC power from the inverter 1204 to the grid 102 or to the premises 104. In an example, the multi-port meter 1102 may receive instructions from the edge computing device 1108, for example, to shed energy production from the inverter 1204 if required. In such an example, the energy produced by the solar panel 1206 may be stored at the battery storage system 1208 for future use. The metrology of the inverter 1204 may occur through the multi-port meter 1102. Additionally, the edge computing device 1108 may be located in the multi-port meter 1102 to make edge decisions regarding control of distributed energy resource devices, such as the solar panel 1206 and the battery storage system 1208 that are electrically coupled to the multi-port meter 1102 through the inverter 1204.

Figure 13:
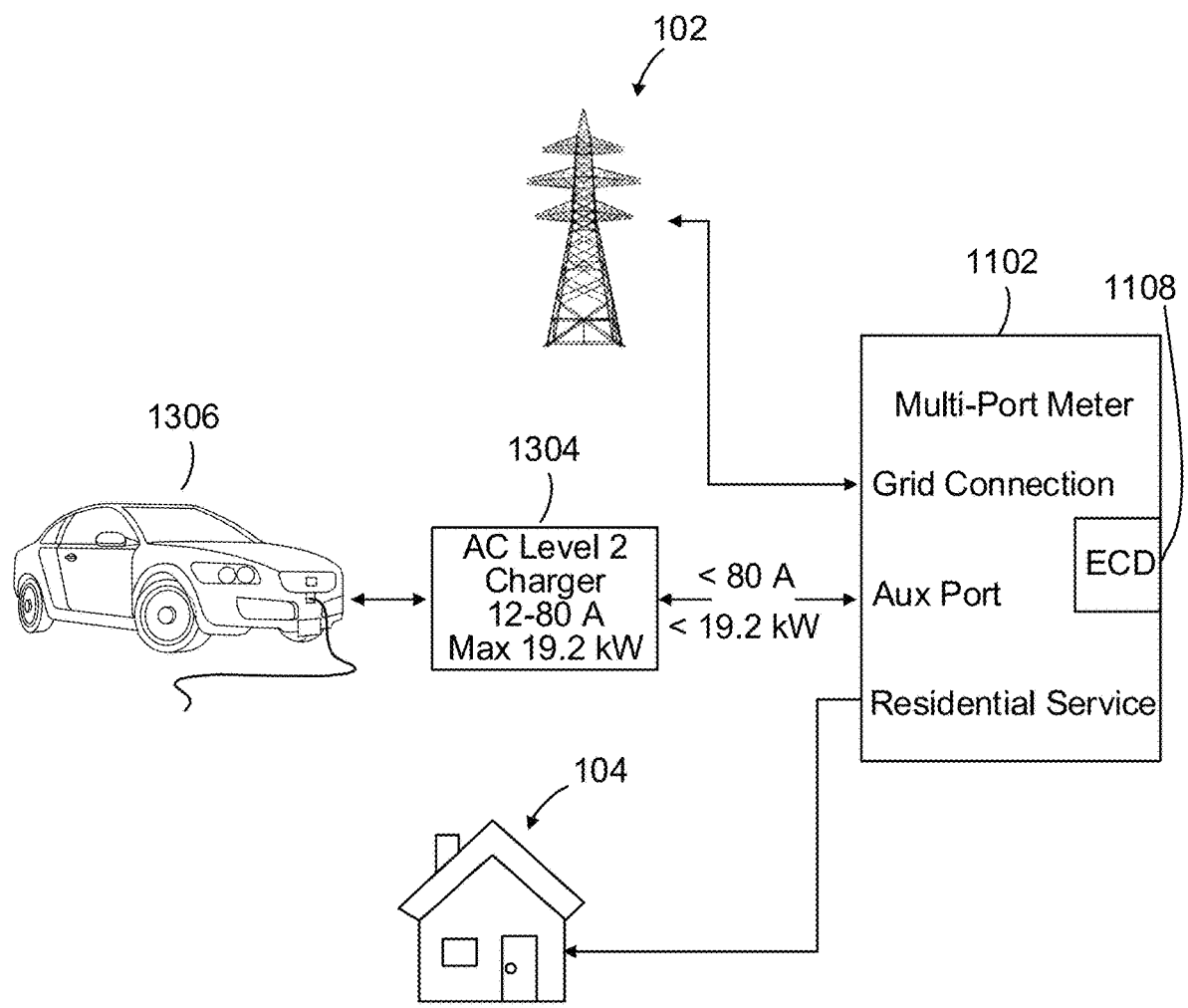
FIG. 13 is a block diagram illustrating an exemplary arrangement of a multi-port meter electrically coupled to an electric vehicle charger.

FIG. 13 is a block diagram illustrating an arrangement of the multi-port meter 1102 electrically coupled to an electric vehicle charger 1304. The metrology of the electric vehicle charger 1304 may occur through the multi-port meter 1102. The electric vehicle charger 1304 may rectify AC mains power received at the multi-port meter 1102 from the grid 102, and apply the rectified DC power to charge an electric vehicle 1306. In some examples, the electric vehicle charger 1304 may also convert the DC power from the electric vehicle 1306 in a manner that enables provision of the resulting AC power for use at the grid 102 or the premises 104. In an example, the edge computing device 1108 may provide instructions to the electric vehicle charger 1304 to charge or discharge a battery of the electric vehicle 1306 at opportune times. For example, the edge computing device 1108 may instruct the electric vehicle charger 1304 to control charge or discharge levels or voltages of the electric vehicle 1306 based on forecasted energy prices or based on predicted overloading of a distribution transformer associated with the premises 104 of the multi-port meter 1102.

The operations of the head-end system, gateway devices, metrology modules, electric meters, edge computing devices, aggregator and control devices, and communications modules described herein may be performed by any suitable computer system. The computing system may include one or more processing elements that execute computer-executable program code stored in a memory device. The memory device may include any suitable computer-readable medium for storing program code and data. The computing system may execute the program code and configure the processing element to perform one or more of the operations described herein. The computing system may include other components, such as one or more network interface devices for establishing a connection to and communicating on a network, and an input/output device, such as a display device.

While the present subject matter has been described in detail with respect to specific aspects thereof, it will be appreciated that those skilled, upon attaining an understand of the foregoing, may readily produce alternations to, variations of, and equivalents to such aspects. Accordingly, it should be understood that the present disclosure has been presented for purposes of example rather than limitation and does not preclude inclusion of such modifications, variations, and/or additions to the present subject matter as would be readily apparent to one of ordinary skill in the art.

What is claimed is:

1. An electric meter including an edge computing device, which is associated with a premises, the electric meter configured for controlling a first load device associated with the premises, and the premises located downstream of a distribution transformer, the electric meter comprising:

a communications module for communicating with a plurality of downstream edge computing devices located downstream of the distribution transformer and with a transformer edge computing device associated with the distribution transformer;

a first port for connecting the first load device to the electric meter; and the edge computing device comprising:

a processor; and a memory for storing computer-readable instructions that when executed by the processor configure the edge computing device for:

sending load forecast information for the first load device and at least one second load device to the transformer edge computing device via the communications module;

receiving price interval data from the transformer edge computing device via the communications module, wherein the price interval data provides a forecasted price for each of a plurality of upcoming time intervals, wherein the price interval data is based in part on a rating of the distribution transformer;

and based on the price interval data, controlling the first load device, so that: when the price interval data includes low-cost time intervals, allowing the first load device to consume power and to operate using one or more normal operating parameters during the upcoming time intervals, and when the price interval data includes high-cost time intervals, controlling the first load device to operate using one or more energy-saving operating parameters during the upcoming time intervals.

2. The electric meter of claim 1, wherein the first load device is an electric vehicle (EV) charger, and controlling the first load device to operate using one or more energy-saving parameters during the upcoming time intervals comprises reducing a charging rate of the EV charger from a current charging rate during the upcoming time intervals.

3. The electric meter of claim 1, wherein the edge computing device further comprises a second port for connecting a second load device associated with the premises to the electric meter, and wherein the electric meter is further configured for:
receiving a user command providing instructions for controlling the second load device; and
based on the price interval data and on the user command, controlling the second load device, so that:
when the price interval data includes high-cost time intervals and the user command allows normal operation of the second load device, allowing the second load device to operate using one or more normal operating parameters during the upcoming time intervals.

4. The electric meter of claim 1, wherein the edge computing device further comprises a second port for connecting a second load device associated with the premises to the electric meter, and wherein the electric meter is further configured for:
after receiving price interval data from the transformer edge computing device, determining future pricing data, wherein the future pricing data corresponds to a plurality of time intervals after the upcoming time intervals; and
based on the future pricing data, controlling the second load device.

5. The electric meter of claim 1, wherein the edge computing device further comprises a second port for connecting a distributed energy resource (DER) device associated with the premises to the electric meter, and wherein the electric meter is further configured for:
when the price interval data includes high-cost time intervals, controlling the DER device to output power to an electric grid.

6. The electric meter of claim 1, wherein the edge computing device is further configured for sending information related to controlling the first load device to other electric meters located downstream of the distribution transformer.

7. The electric meter of claim 1, wherein the edge computing device is further configured for receiving a communication from the transformer edge computing device for controlling the first load device.

8. A method of controlling at least one load device and at least one distributed energy resource (DER) device, the method comprising:
receiving, at an edge computing device associated with an electric meter connected to an electric grid and a premises, price interval data, wherein the price interval data provides a forecasted price for each of a plurality of upcoming time intervals;
determining, by the edge computing device, future pricing data, wherein the future pricing data corresponds to a plurality of time intervals after the upcoming time intervals wherein the pricing data is based in part on a rating of the distribution transformer; and
based on the price interval data and the future pricing data, controlling a plurality of load devices associated with the electric meter, wherein the load devices associated with the electric meter include the at least one load device and the at least one DER device, so that:
when the price interval data and the future pricing data both include low-cost time intervals, allowing the at least one load device to consume power and to operate using one or more normal operating parameters,
when the price interval data and the future pricing data both include high-cost time intervals, controlling the at least one DER device to output power to the electric grid, and
when the price interval data includes high-cost time intervals and the future pricing data includes low-cost time intervals, controlling the at least one load device to modify its operation to operate using one or more energy-saving operating parameters during the upcoming time intervals and to operate using the one or more normal operating parameters after the upcoming time intervals.

9. The method of claim 8, further comprising:
receiving, at the edge computing device, a communication from a transformer edge computing device for controlling the at least one load device, wherein the electric meter is located downstream of a distribution transformer associated with the transformer edge computing device.

10. The method of claim 8, wherein the at least one DER device has a charging mode, further comprising:
when the price interval data and the future pricing data both include low-cost time intervals, allowing the at least one DER device to consume power and to operate in the charging mode.

11. The method of claim 8, further comprising:
receiving, at the edge computing device, a user command for the at least one load device; and
controlling the at least one load device so that:
when the price interval data and the future pricing data both include high-cost time intervals, allowing the at least one load device to consume power and to operate using one or more normal operating parameters.

12. The method of claim 8, wherein the at least one load device is an electric vehicle (EV) charger, and controlling the at least one load device to modify its operation to operate using one or more energy-saving operating parameters during the upcoming time intervals comprises reducing a charging rate of the EV charger from a current charging rate during the upcoming time intervals.

13. The method of claim 8, wherein the price interval data and the future pricing data are determined differently, and the future pricing data is based on meter-specific data.

14. A method of controlling a plurality of chargers, wherein each charger is associated with a meter and a premises, the method comprising:
providing an edge computing device associated with a distribution transformer, wherein the distribution transformer provides power to each of the premises;
forecasting, by the edge computing device, a forecasted load associated with the distribution transformer;
forecasting, by the edge computing device, individual premises forecasted loads for each of the premises;
based on the forecasted load and the individual premises forecasted loads forecast by the edge computing device, controlling the chargers so that:
when the forecasted load exceeds a threshold, controlling at least one of the chargers to reduce a charging rate of the at least one of the chargers, wherein the at least one of the chargers is selected based on the individual premises forecasted load for the premises associated with the at least one of the chargers and after controlling at least one of the chargers to reduce a charging rate of the at least one of the chargers, allowing a second one of the chargers to maintain a second charging rate; and when the forecasted load does not exceed the threshold, allowing the chargers to charge.

15. The method of claim 14, wherein controlling at least one of the chargers to reduce a charging rate of the at least one of the chargers, comprises controlling the plurality of chargers to reduce the charging rate of each of the plurality of chargers.

16. The method of claim 14, further comprising:
receiving, by the edge computing device, load data from each of the meters associated with the chargers; and
using the load data for forecasting the individual premises forecasted loads.

17. The method of claim 15, wherein a reduction in the charging rate of a first one of the chargers differs from a reduction in the charging rate of a second one of the chargers.

18. The method of claim 14, further comprising:
generating price interval data, wherein the price interval data provides a forecasted price for each of a plurality of upcoming time intervals; and
communicating the price interval data to the meters associated with the chargers.

* * * * *